United States Patent
Fox

(10) Patent No.: US 9,778,285 B2
(45) Date of Patent: Oct. 3, 2017

(54) ELECTRICAL SENSOR SYSTEMS AND METHODS

(71) Applicant: FLIR Systems, Inc., Wilsonville, OR (US)

(72) Inventor: Michael Fox, Nashua, NH (US)

(73) Assignee: FLIR Systems, Inc., Wilsonville, OR (US)

(*) Notice: Subject to any disclaimer, the term of this patent is extended or adjusted under 35 U.S.C. 154(b) by 156 days.

(21) Appl. No.: 14/486,882

(22) Filed: Sep. 15, 2014

(65) Prior Publication Data
US 2015/0002138 A1 Jan. 1, 2015

Related U.S. Application Data

(63) Continuation of application No. PCT/US2013/032618, filed on Mar. 15, 2013.

(60) Provisional application No. 61/612,099, filed on Mar. 16, 2012.

(51) Int. Cl.
*G01R 1/067* (2006.01)
*G01R 15/14* (2006.01)
*G01R 15/18* (2006.01)
*G01R 15/20* (2006.01)

(52) U.S. Cl.
CPC ........ *G01R 1/06788* (2013.01); *G01R 15/142* (2013.01); *G01R 15/181* (2013.01); *G01R 15/202* (2013.01)

(58) Field of Classification Search
CPC .......................... G01R 1/06788; G01R 15/142
USPC ........................................................ 324/149
See application file for complete search history.

(56) References Cited

U.S. PATENT DOCUMENTS

| | | | | |
|---|---|---|---|---|
| 3,434,052 A * | 3/1969 | Fechant | ............... | G01R 15/181 324/127 |
| 4,540,940 A * | 9/1985 | Nolan | ............... | G01R 1/06788 324/133 |
| 6,414,474 B1 * | 7/2002 | Gohara | ............... | G01R 15/207 324/117 H |
| 7,230,413 B2 * | 6/2007 | Zhang | ............... | G01R 15/181 324/117 R |
| 7,755,347 B1 | 7/2010 | Cullen et al. | | |

(Continued)

FOREIGN PATENT DOCUMENTS

EP 2278344 1/2011

*Primary Examiner* — Christopher Mahoney
(74) *Attorney, Agent, or Firm* — Haynes and Boone, LLP

(57) ABSTRACT

Various techniques are disclosed for providing electrical current and/or voltage sensor probes or tags integrated with measurement circuitry. For example, an electrical sensor is provided that includes a probe adapted to be arranged to at least partially encircle a conductor to be measured, wherein the probe has a proximal end and a distal end, the proximal end terminating in a base portion that houses measurement circuitry. The base portion may also include electrical components suitable for displaying, wirelessly transmitting, and/or otherwise conveying the measured electrical parameters. In some embodiments, the distal end of the probe may be removably received by the base portion, such that the probe forms a loop encircling the conductor when measuring it. In other embodiments, the probe may resiliently clip on to the conductor. In another example, an electrical sensor includes an attachable tag that can be mounted to the conductor to be measured.

20 Claims, 8 Drawing Sheets

(56) References Cited

U.S. PATENT DOCUMENTS

| | | | |
|---|---|---|---|
| 9,007,077 B2* | 4/2015 | El-Essawy | G01R 15/205 324/117 H |
| 2003/0030428 A1* | 2/2003 | Rautiainen | G01R 15/142 324/127 |
| 2004/0212512 A1 | 10/2004 | Stewart | |
| 2005/0211381 A1* | 9/2005 | Turner | G01R 15/142 156/345.28 |
| 2005/0275397 A1 | 12/2005 | Lightbody et al. | |
| 2008/0077336 A1 | 3/2008 | Fernandes | |
| 2014/0035607 A1* | 2/2014 | Heydron | G01R 1/04 324/754.02 |
| 2014/0035608 A1* | 2/2014 | Mertens | G01R 31/002 324/754.03 |
| 2014/0039838 A1* | 2/2014 | Katz | G01R 1/04 702/188 |
| 2014/0333284 A1* | 11/2014 | Dames | G01R 15/181 324/76.11 |

* cited by examiner

ELECTRICAL SENSOR SYSTEMS AND METHODS

CROSS-REFERENCE TO RELATED APPLICATION

This application is a continuation of International Patent Application No. PCT/US2013/32618 filed Mar. 15, 2013 and entitled "ELECTRICAL SENSOR SYSTEMS AND METHODS", which is incorporated herein by reference in its entirety.

International Patent Application No. PCT/US2013/32618 claims the benefit of U.S. Provisional Patent Application No. 61/612,099 filed Mar. 16, 2012 and entitled "ELECTRICAL CURRENT SENSOR", which is incorporated herein by reference in its entirety.

TECHNICAL FIELD

One or more embodiments of the invention relate generally to sensors and more particularly, for example, to electrical current and/or voltage sensors and other types of sensors to measure various electrical parameters.

BACKGROUND

Clamp meters are a common form of current sensor used to measure current flowing in conductors. Such clamp meters include a spring-actuated clamp that a user may open up and clamp about a conductor (or conductors) that a user would like to measure. Auxiliary flexible probes, which can be connected via external leads to conventional meters, are also popular for current measurement applications. Thus, combination clamp meters with auxiliary current probe options have been developed. Regardless of whether a user measures current with a clamp meter or an auxiliary flexible probe, the user must spend considerable time positioning the meter or probe correctly. While auxiliary probes may provide more flexibility than clamps, it is still cumbersome to carry, route, connect, or otherwise handle the external lead wires of auxiliary probes. Moreover, the user's close proximity to high voltages or currents in the conductors may be dangerous. Accordingly, there is a need in the art for improved electrical sensors that diminish the amount of manual labor necessary and associated risk to the user.

SUMMARY

Various techniques are disclosed for providing electrical current and/or voltage sensor probes or tags integrated with measurement circuitry. For example, in accordance with various embodiments of the disclosure, an electrical sensor includes a probe adapted to be arranged to at least partially encircle a conductor to be measured, wherein the probe has a proximal end and a distal end, the proximal end terminating in a base portion that houses measurement circuitry. The base portion may also include electrical components suitable for displaying, wirelessly transmitting, and/or otherwise conveying the measured electrical parameters. In some embodiments, the distal end of the probe may be removably received by the base portion, such that the probe forms a loop encircling the conductor when measuring it. In other embodiments, the probe may resiliently clip on to the conductor.

In an example according to another embodiment of the disclosure, an electrical sensor includes an attachable tag that can be mounted to the conductor to be measured. For example, the tag can be mounted magnetically or by using adhesives. The tag includes electrical components suitable for measuring current and/or voltage, and for displaying, wirelessly transmitting, and/or otherwise conveying the measured electrical parameters.

In various embodiments, the electrical sensor may be configured to measure the current flowing through the conductor. For example, in some embodiments, the electrical sensor may utilize a Rogowski coil, an iron (or ferrite) core current transformer, or other appropriate component for sensing current through induction. In some embodiments, the electrical sensor may utilize a Hall effect sensor, which can allow both AC and DC measurements. In various embodiments, the electrical sensor may be configured to measure the voltage associated with the conductor. For example, in some embodiments, the electrical sensor may be configured to sense voltage via capacitive coupling. In other embodiments, the electrical sensor may utilize physical connectors to measure voltage directly. In some embodiments, the electrical sensor may be configured to measure both the current and the voltage associated with the conductor. In such embodiments, the measurement circuitry may be further configured to calculate electrical power and/or measure voltage harmonics.

Therefore, various embodiments of the electrical sensor disclosed herein may permit convenient measurement of various electrical parameters associated with a conductor without a need for conventional meter devices or external leads required to connect to such conventional meter devices.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1A:
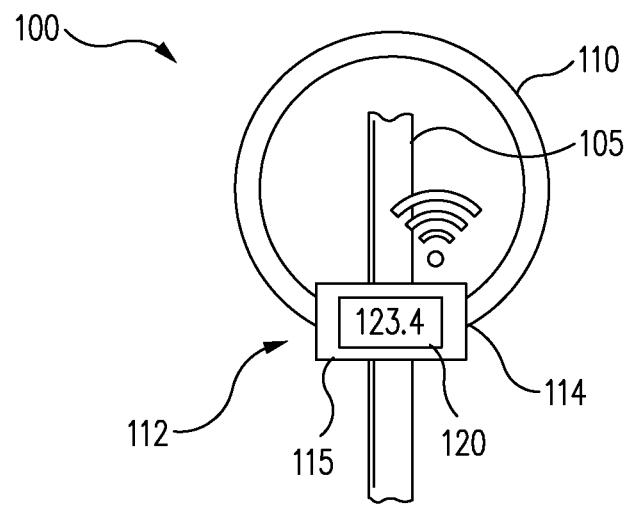
FIG. 1A illustrates an electrical sensor implemented as a probe having a base portion integrated with a display and measurement circuitry, according to an embodiment of the disclosure.

A more complete understanding of embodiments of the invention will be afforded to those skilled in the art, as well as a realization of additional advantages thereof, by a consideration of the following detailed description of one or more embodiments. It should be appreciated that like reference numerals are used to identify like elements illustrated in one or more of the figures.

DETAILED DESCRIPTION

To address the shortcomings in the electronic sensor arts, various techniques are disclosed herein for providing electrical current and/or voltage sensor probes or tags integrated with measurement circuitry. As further described herein, such sensor probes or tags do not require external meter devices or external lead wires for connecting to external meter devices. Such sensor probes or tags may also be configured to display and/or wirelessly transmit data indicative of measured electrical parameters. Electrical sensor embodiments having a probe will be described first.

Turning now to the drawings, FIG. 1A shows an electrical sensor 100 having a flexible probe 110 that terminates in a base portion 115 integrated with measurement circuit, according to an embodiment of the disclosure. Electrical sensor 100 may be configured to measure current and/or voltage in a conductor 105 at least partially encircled by flexible probe 110. In some embodiments, electrical sensor 100 may measure other electrical parameters. It is contemplated for other embodiments that flexible probe 110 may instead be substantially rigid, such that the probe substantially retains its shape.

In some embodiments, electrical sensor 100 is an inductive sensor, although in other embodiments capacitive sensor embodiments may also be used. For the inductive embodiments, flexible probe 110 may comprise a Rogowski coil, an iron (or ferrite) core current transformer, or other appropriate transducer. In some embodiments, electrical sensor 100 may comprise a Hall effect sensor that allows both AC and DC measurements. In some embodiments, flexible probe 110 may comprise a coil or transducer configured for measurement of voltage associated with conductor 105 via a capacitive coupling technique known in the art.

One end 112 of flexible probe 110 may terminate in base portion 115 that may house measurement circuitry and other electronic components. In the illustrated embodiment of FIG. 1A, base portion 115 may be configured to removably receive an opposing end 114 of flexible probe 110, such that flexible probe 110 forms a loop encircling conductor 105 as shown.

Also in the illustrated embodiment of FIG. 1A, base portion 115 is shown as comprising an optional display 120. In some embodiments, display 120 may include digital or alphanumeric display implemented using a segmented LCD display, dot matrix display, TFT LCD screen, or other appropriate display component suitable for presenting measured electrical parameters in numbers. In some embodiment, display 120 may include indicator LEDs or other types of indicator suitable for indicating various conditions associated with conductor 105 being measured. For example, display 120 may include colored light indicators for indicating a "Normal" or "Abnormal" condition to allow users to quickly understand the condition of conductor 105, or may include light bars that light up to visually convey various electrical parameters associated with conductor 105.

Figure 2:
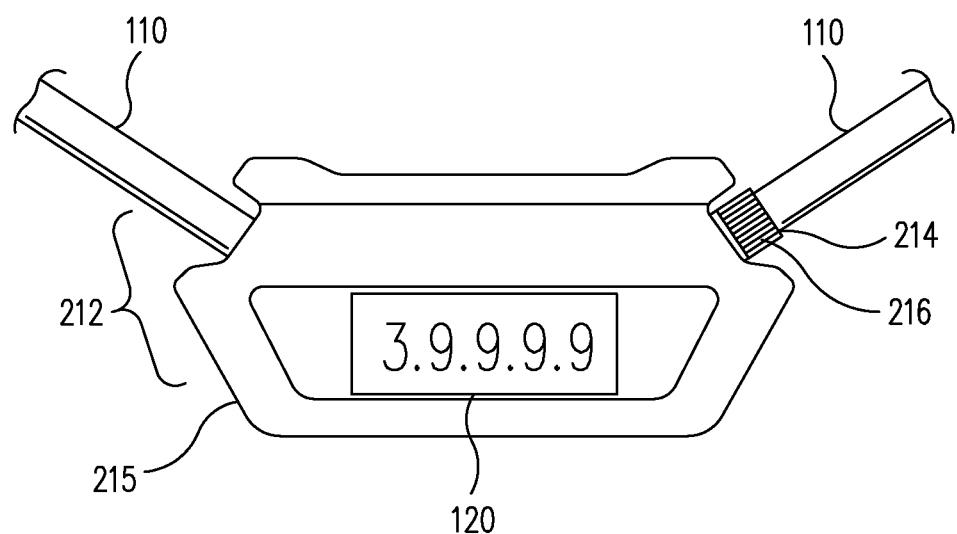
FIG. 2 is a close-up view of the display and the base portion of the probe in the electrical sensor of FIG. 1, according to an embodiment of the disclosure.

An example base portion 215 may be better seen in a close-up view in FIG. 2. In an example embodiment, one end 212 of flexible probe 110 may terminate in a base portion 215 comprising display 120, where as an opposing end 214 of flexible probe 110 may be removably received by a socket 216 or other appropriate connector that allows opposing end 214 to be detachably coupled to base portion 215. This allows flexible probe 110 to form a loop encircling conductor 105, by detaching opposing end 214, looping flexible probe 110 about conductor 105, and coupling opposing end 214 back to socket 216, in accordance with an embodiment.

Figure 1B:
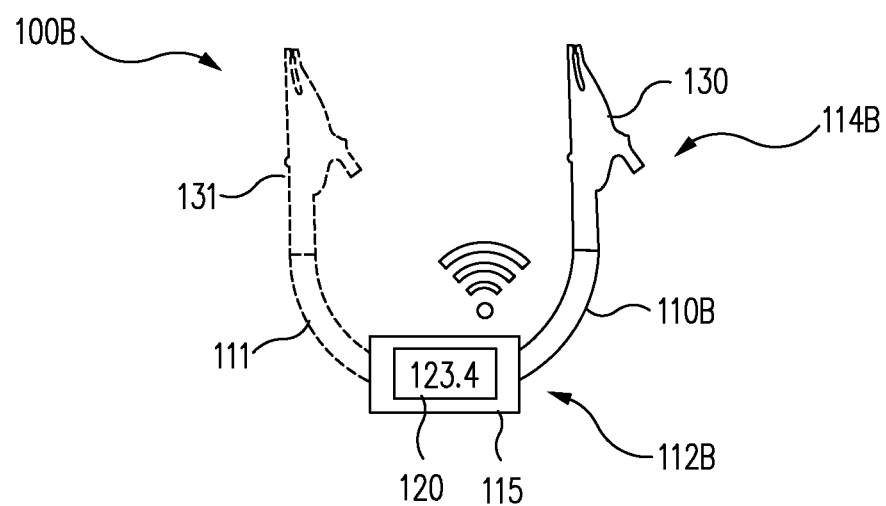
FIG. 1B illustrates an alternative embodiment of the electrical sensor of FIG. 1A.

Referring now to FIG. 1B, another example of an electrical sensor 100B is shown according to another embodiment of the disclosure. In electrical sensor 100B, a flexible probe 110B may comprise one end 112B terminating in base portion 115 described above for FIG. 1A, but also an opposing end 114B that terminates in a connector 130 (e.g., an alligator clip) adapted to form an electrical connection with conductor 105 for measuring electrical parameters associated with conductor 105. In some embodiments, electrical sensor 110B may optionally comprise an additional flexible probe 111 that terminates in a connector 131 (e.g., an alligator clip) as desired for particular applications. Electrical sensor 100B having connectors 130 and/or 131 may be useful where voltage measurement via capacitive coupling is undesirable or unavailable.

Figure 1C:
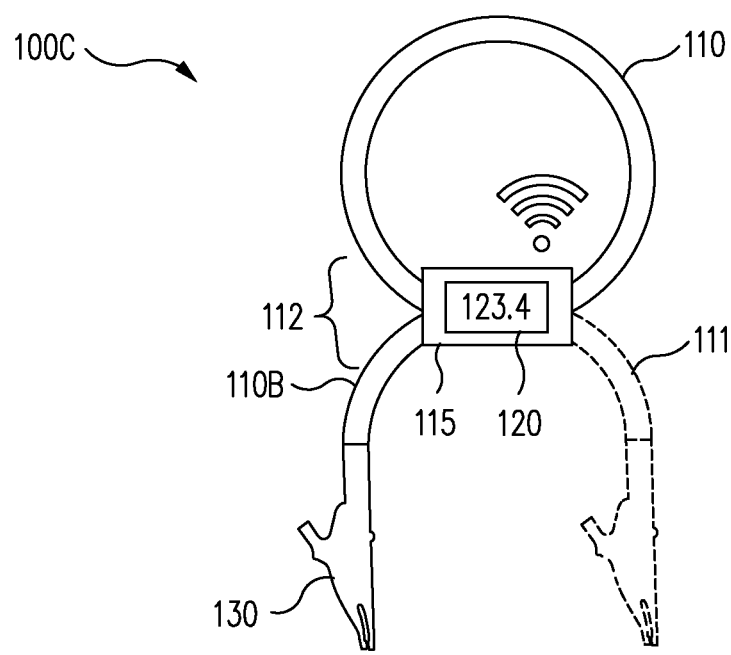
FIG. 1C illustrates another alternative embodiment of the electrical sensor of FIG. 1A.

FIG. 1C shows yet another example of an electrical sensor 100C according to another embodiment of the disclosure. Electrical sensor 100C may comprise both flexible probe 110 of the embodiment in FIG. 1A and flexible probe 110E of the embodiment in FIG. 1B. In some embodiments, electrical sensor 100C may comprise the optional flexible probe 111 of the embodiment in FIG. 1a It is also contemplated for other embodiments that flexible probe 110B and/or flexible probe 111 may be substantially rigid as to substantially retain its shape.

Figure 3:
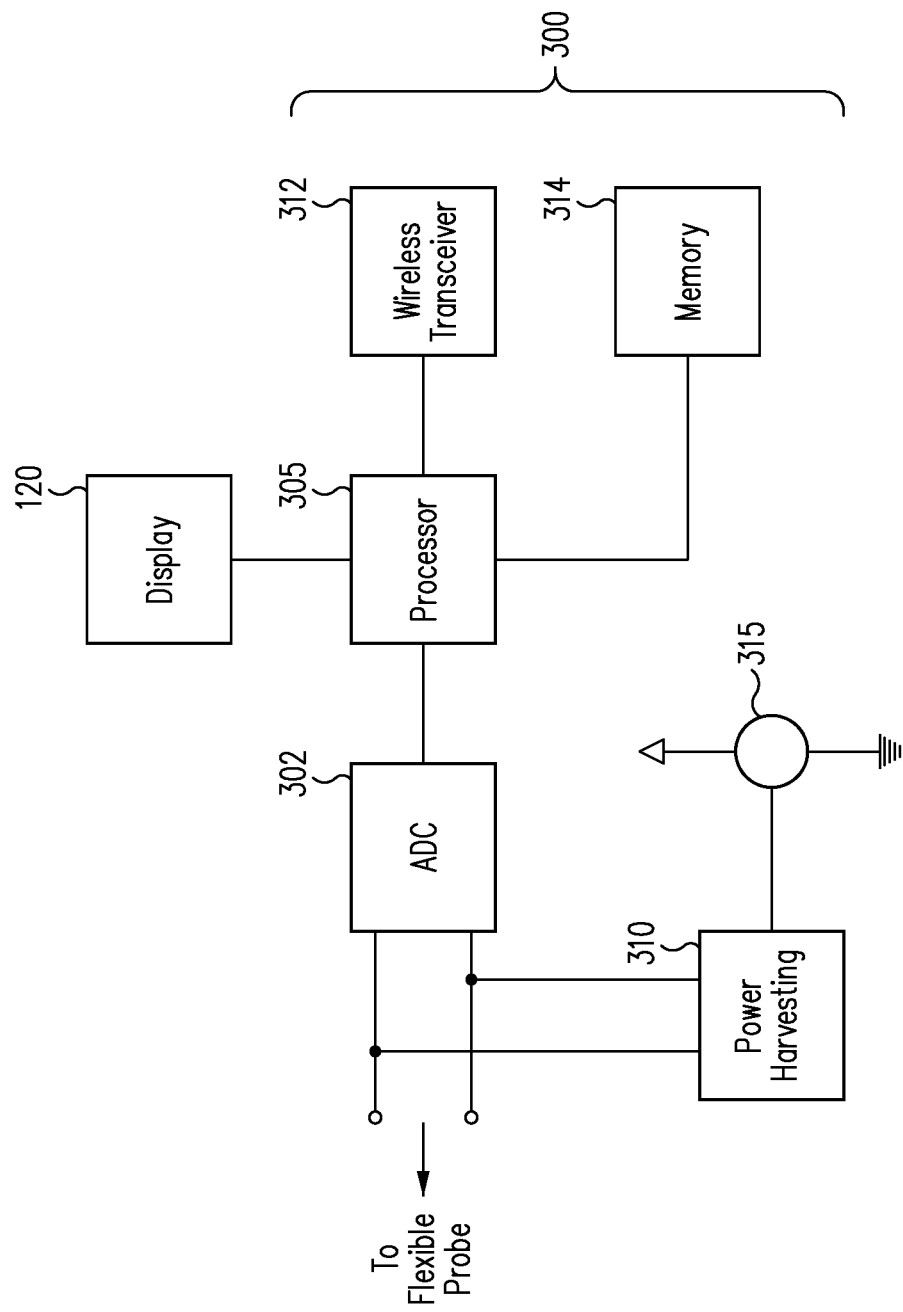
FIG. 3 is a block diagram of circuitry within the base portion of the probe of FIG. 1A, 1B, or 1C, according to an embodiment of the disclosure.

FIG. 3 shows example measurement circuitry 300 that may be housed within base portion 115, according to an embodiment of the disclosure. An analog-to-digital converter (ADC) 302 digitally converts the analog current and/or voltage induced in flexible probe 110. A logic circuit, such as for example a microcontroller or microprocessor 305, can be configured to determine a current and/or voltage associated with conductor 105 based on the digitally converted output. In some embodiments, the logic circuit (e.g., microprocessor 305) may be configured to calculate power associated with conductor 105 based on the measured current and voltage. In some embodiments, the logic circuit (e.g., microprocessor 305) may be configured to determine voltage and/or current harmonics based on measurements obtained over some duration. In some embodiments, measurement circuitry 300 may include a low pass filter that limits frequency to below a certain level.

Battery 315 provides power to measurement circuitry 300. Optionally for some embodiments, measurement circuitry 300 may comprise a power harvesting circuit 310 adapted to divert power induced in flexible probe 110 (or from an ancillary coil) for storage in battery 315. Alternatively, battery 315 may be a replaceable battery in lieu of power harvesting circuit 310. In some embodiments, a photovoltaic panel (not shown) may be utilized for generating power additionally or alternatively to power harvesting circuit 310.

In some embodiments, measurement circuit 300 may include a wireless transceiver 312 that may be utilized to wirelessly transfer data indicative of the measured electrical parameters and/or other data to an external device and/or over a network (e.g., including the Internet). Wireless transceiver 312 may in some embodiments be RF-based. For example, in some embodiments, wireless transceiver 312 may be configured to transmit and/or receive data via standard wireless communication protocols/standards such as the IEEE 801.11 WiFi standards, the Bluetooth™ standard, and/or the ZigBee™ standard. In another example, wireless transceiver 312 may implement a proprietary RF-based communication protocol.

Wireless transceiver 312 in other embodiments may implement an optical transmission technique. In such embodiments, base portion 112 may comprise, on an exterior surface thereof, an optical transmitter (e.g., an LED) and/or an optical sensor. For example, wireless transceiver 312 may be configured to transmit modulated pulses of light that encodes data. The light may be infrared or near infrared light as used in IrDA specifications, laser, or any other suitable light. In another example, rather than actively generating transmitting light pulses, wireless transceiver 312 may be implemented using a modulating retro-reflector (MRR) that can modulate incoming light (e.g., by selectively reflecting using actuating mirrors or altering surface reflectivity) to transmit data. It is also contemplated for some embodiments that a photosensor may be used to detect a triggering light (e.g., a laser light pointed to it), so that measurement circuitry 300 may be responsively activated to perform measurements or other operations.

Measurement circuit 300 in some embodiments may optionally include a memory device 314. Microprocessor 305 or other logic device may be configured to store measurement data, even data, and/or other data onto memory device 314 for data logging and other purposes. Memory device 314 may also be configured to store a unique identifier associated with electrical sensor 100/100B/100C. The unique identifier may be utilized, for example, to associate measurement data with a specific electrical sensor. In some embodiments, memory device 314 may internally fixed to electrical sensor 100/100B/100C. In other embodiments, memory device 314 may additionally or alternatively include a removable memory such as a Secure Digital (SD) card memory or other similar removable non-volatile memory.

As may be understood, various components of circuitry 300 are given above as an example, and as such, the various components of measurement circuitry 300 may be combined into fewer components or further divided into more components without departing from the scope and spirit of the disclosure. Moreover, although base portion 115 may be rigid, it will be appreciated that measurement circuitry 300 may be mounted on a substrate and covered by a flexible insulating material to form base portion 115.

Figure 4:
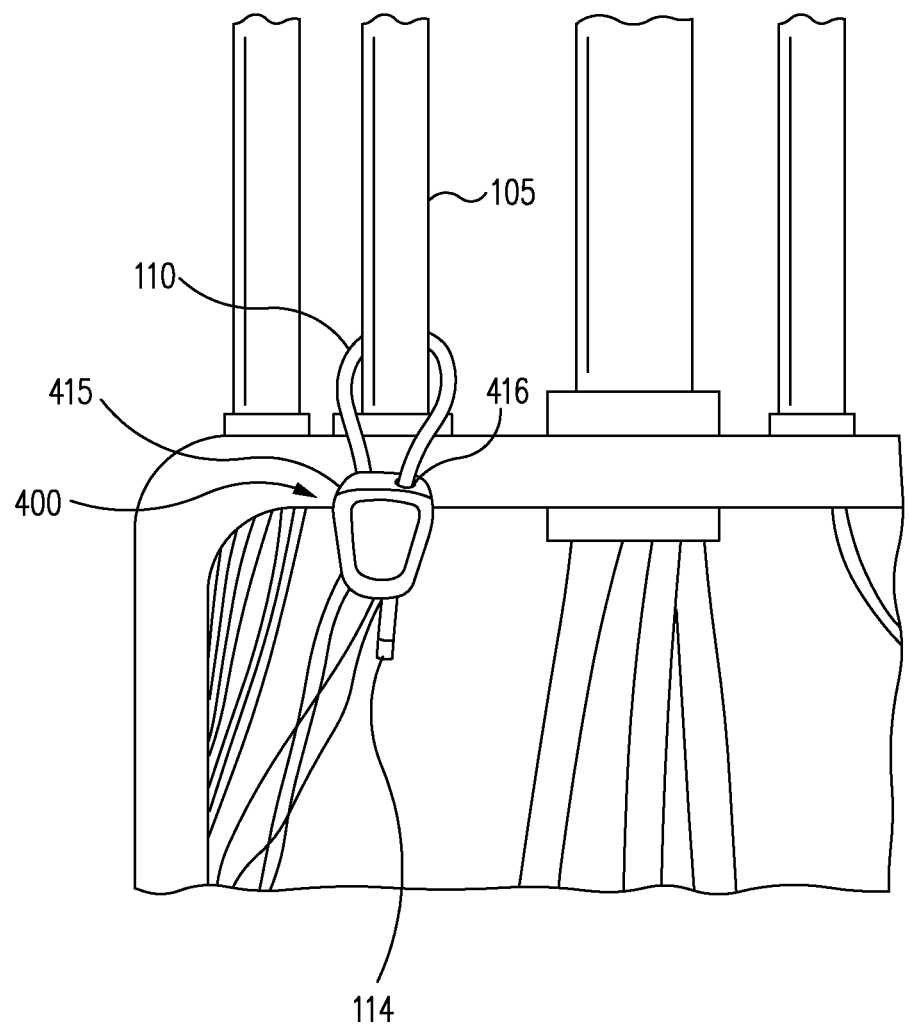
FIG. 4 illustrates another alternative embodiment of the electrical sensor of FIG. 1A, wherein a loop formed by the probe may be adjusted for size.

FIG. 4 illustrates an electrical sensor 400 in accordance with another embodiment of the disclosure. Electrical sensor 400 may be an alternative embodiment of electrical sensor 100 of FIG. 1A. As shown, base portion 415 of flexible probe 110 may include a pass-through port 416 for accommodating unneeded length of flexible probe 110. Opposing end 114 of flexible probe 110 can be threaded through pass-through port 416 to adjust the length of the loop formed by flexible probe 110 as necessary to accommodate a given conductor 105 or conductors.

Figure 5A:
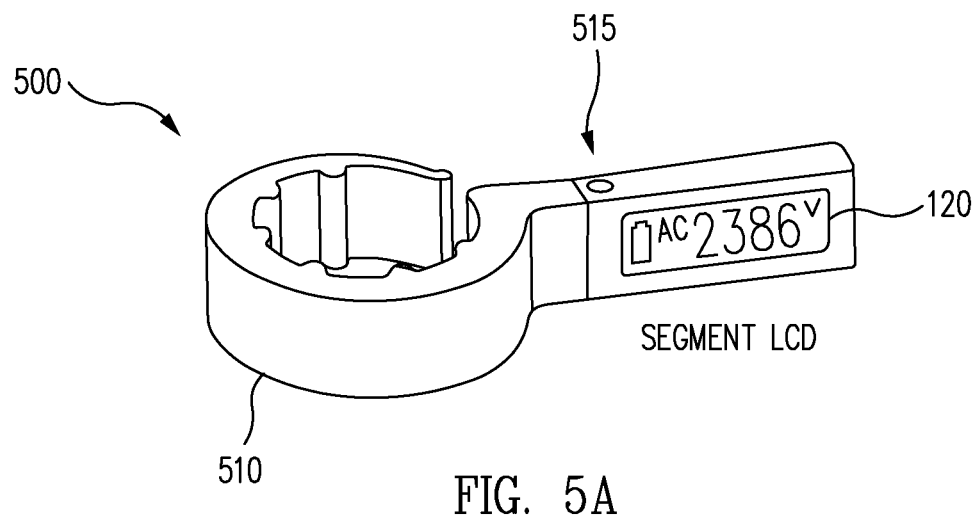
FIG. 5A illustrates another alternative embodiment of the electrical sensor of FIG. 1A, wherein the probe may be resiliently clipped to a conductor to be measured.
Figure 5B:
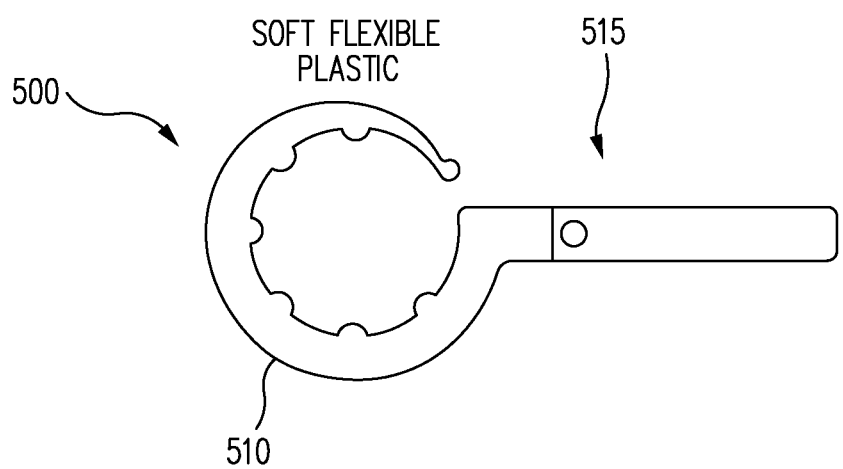
FIG. 5B is a top view of the electrical sensor of FIG. 5A.
Figure 5C:
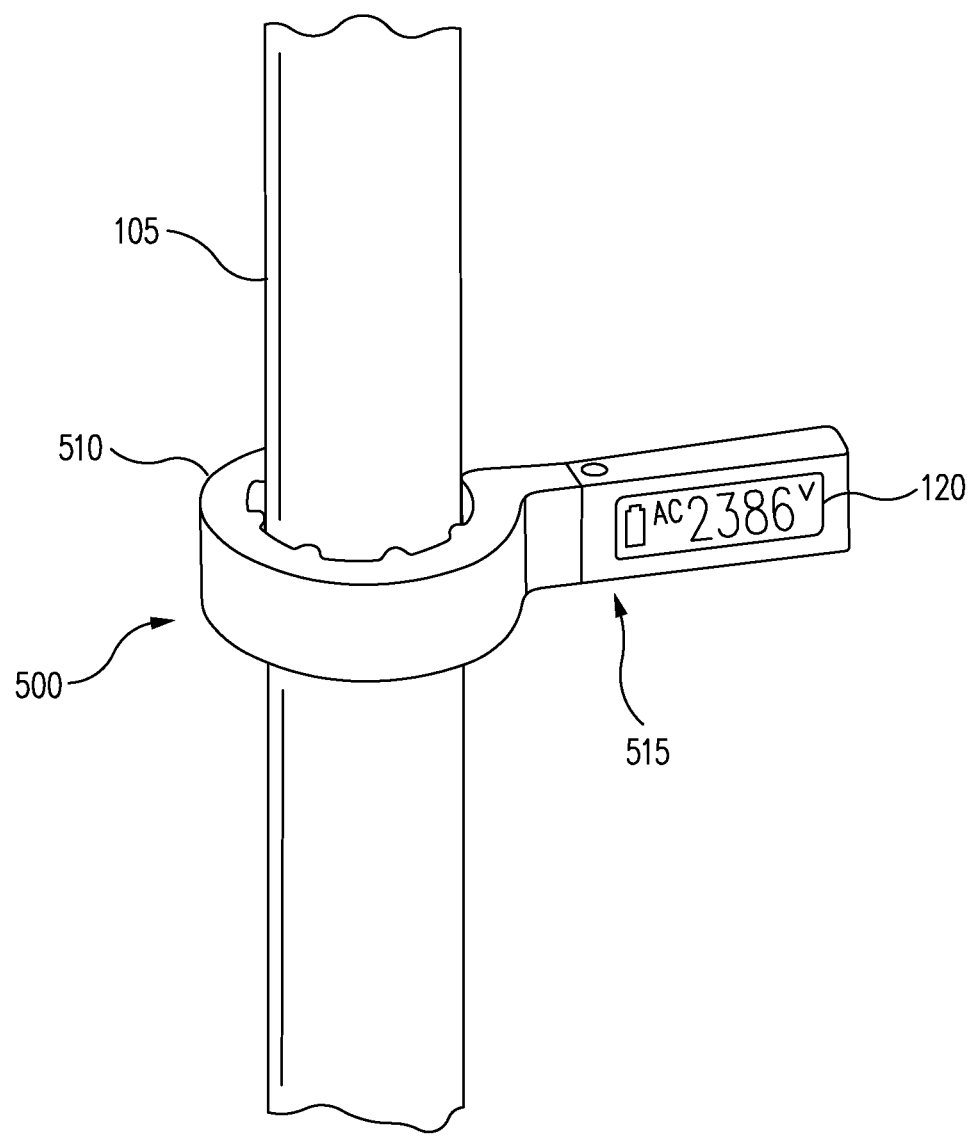
FIG. 5C illustrates the electrical sensor of Figure SA clipped on to a conductor.

FIGS. 5A-5C illustrate an electrical sensor 500 wherein a probe 510 is configured to be resiliently clipped on to conductor 105, in accordance with an embodiment of the disclosure. Probe 510 may terminate at one end in a base portion 515, which may comprise measurement circuitry 300 of FIG. 3 and also optionally comprise display 120 similar to electrical sensor 100/100B/110C described above. As with flexible probe 110 described above, probe 510 may comprise a Rogowski coil, an iron (or ferrite) core current transformer, a Hall-effect sensor, or other appropriate transducer.

Probe 510 may be flexible yet more rigid than flexible probe 110 of electrical sensor 100 above, such that probe 510 retains its shape. For example, probe 510 may comprise walls made of rubber or soft plastic. As seen in FIG. 5C, probe 510 may be appropriately dimensioned and have appropriate rigidity and friction, such that probe 510 may be resiliently clipped on to conductor 105 (e.g., a cable or cable bundle) and held in place via elastic and frictional force. Thus, electrical sensor 500 may be conveniently mounted onto conductor 105 in a permanent or semi-permanent fashion. For example, electrical sensor 500 may be installed on a conductor within an electrical cabinet. Such cabinets contain a number of relatively-dangerous conductors due to the high amounts of current or voltages. Even if such conductors are fully insulated, it is cumbersome and/or dangerous for a user to manually clamp them with a clamp meter or encircle them with an auxiliary flexible probe. But electrical sensor 500 may be installed during construction (or later) of the electrical cabinet so that subsequent users need merely open the electric cabinet and view display 120 or wirelessly obtain a quick reading of the current and/or voltage.

The probe type electrical sensor in its various embodiments described above may be utilized to obtain a measurement by performing the following: To obtain a measurement of one or more electrical properties associated with a target object (e.g., a cable, bundle of cables, or other type of conductor), probe 110/510 may be arranged relative to the target object such that probe 110/510 at least partially encircles the target object. For example, probe 110 may be looped about the target object. Opposing end 114 of probe 110 may be releasably attached to socket 216 or other engagement mechanism on base portion 115 to form a closed loop for some embodiments, or threaded through pass-through port 416 to achieve a desired length of the loop formed by probe 110 for other embodiments. For probe 510, it may be deformed against the target object so that probe 510 elastically receives the target object as described above with respect to FIG. 5. Connector 130/131 of probe 110B/111 may also be connected to the target object for embodiments that comprise connector 130/131.

The measurement circuitry may be activated so that it determines an electrical property associated with the target object. For some embodiments, the activation may be by pressing a button or otherwise engaging an input mechanism provided on the electrical sensor. In some embodiments, the measurement circuitry may be wirelessly activated. For example, an activation command may be transmitted to the measurement circuitry via wireless transceiver 312. In another example, a triggering light beam may be directed to a photosensor on the electrical sensor to trigger a measurement and/or wireless transmission operation, as described above.

In some embodiments, the measurement may then be obtained by viewing alphanumeric characters presented on display 120, or by observing indicator lights or light bars on display 120. In some embodiments, the measurement may be wirelessly received by various mechanisms described above for wireless transceiver.

Figure 6A:
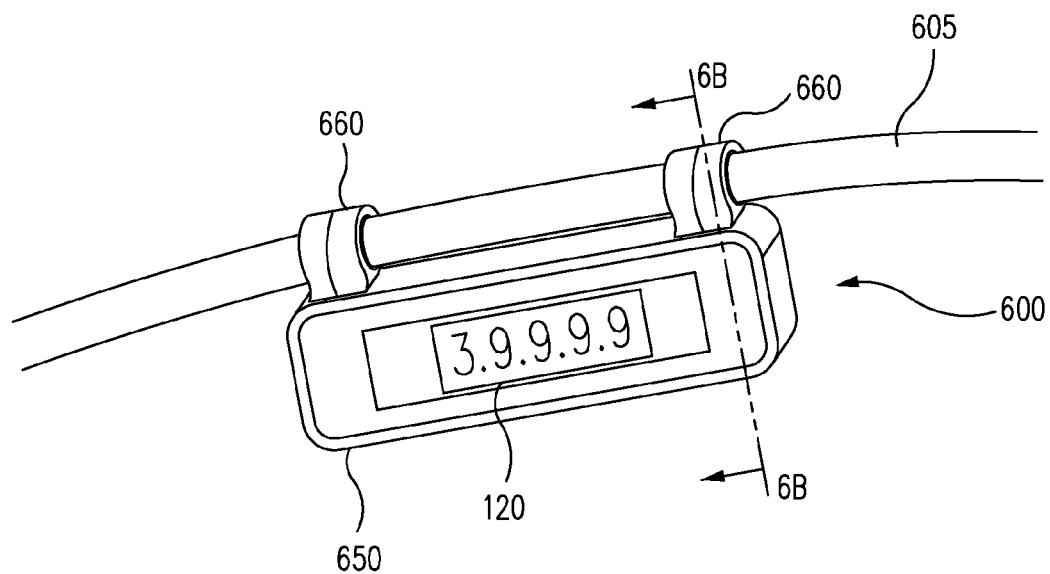
FIG. 6A illustrates is a clip-on type electrical sensor according to an embodiment of the disclosure.
Figure 6B:
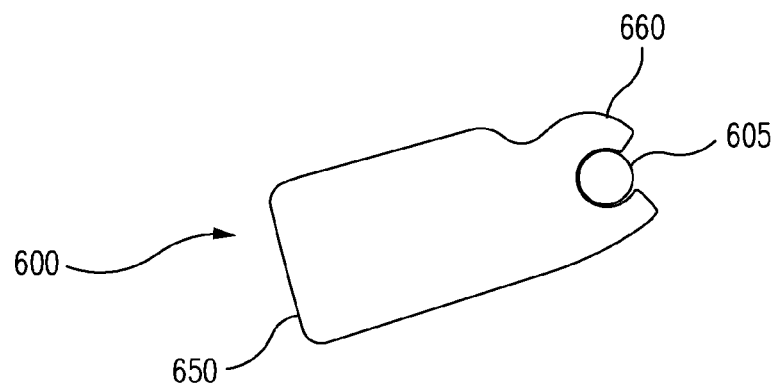
FIG. 6B is a cross-sectional view along line 6B-6B of the electrical sensor of FIG. 6A.

Turning now to FIG. 6A, a clip-on type electrical sensor 600 is illustrated in accordance with an embodiment of the disclosure. In such an embodiment, a housing 650 may include an internal capacitive or inductive sensor for sensing current and/or voltage in a conductor 605. Housing 650 may also house measurement circuitry 300 and optionally include display 120 described above. As also shown in FIG. 6B illustrating a cross-sectional view along line 6B-6B of electrical sensor 600, one or more circular clips 660 may be utilized to grasp conductor 605 to hold housing securely to conductor 605. For example, circular clips 660 may be more suitable for clipping onto a thinner cable or bundle of cables than those suitable for probe 510 of electrical sensor 500. However, circular clip 660 may be modified as desired to accommodate conductor 605 of other sizes.

Figure 7A:
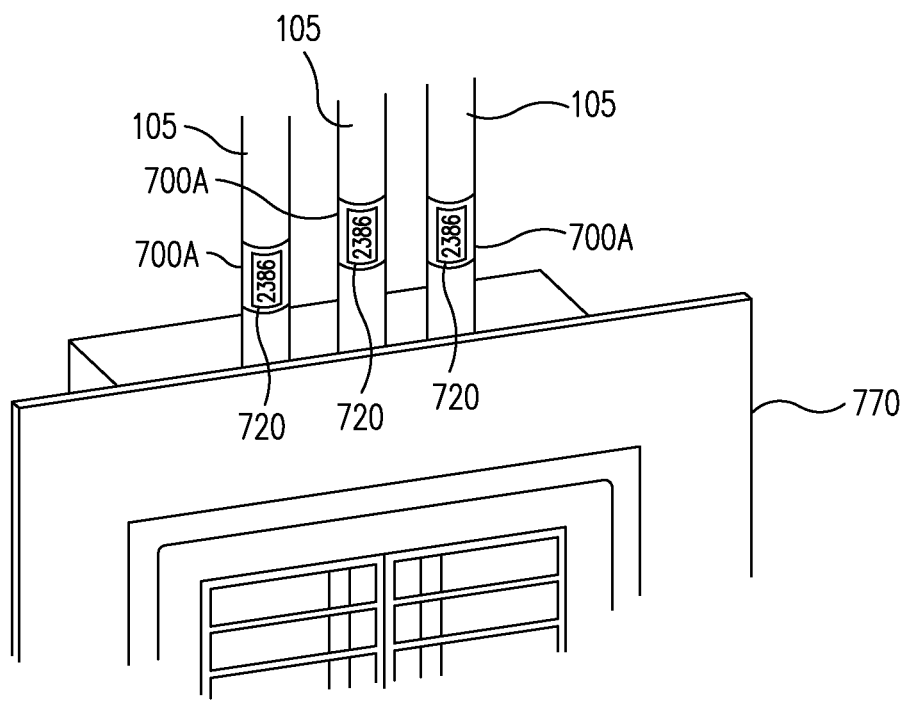
FIG. 7A illustrates electrical sensors implemented as attachable tags integrated with a display and measurement circuitry, in accordance with an embodiment of the disclosure.

To decrease the costs and increase the convenience even further, an electrical sensor implemented as a small attachable tag may be used. For example, FIG. 7A shows electrical sensor tags 700A attached to conductors 105, in accordance with an embodiment of the disclosure. Sensor tag 700A is shown as comprises an optional display 720 for numerically presenting electrical parameters associated with conductor 105. Display 720 may be similar to display 120, except that display 720 is miniaturized and/or formed on a flexible substrate (e.g., flexible LCD sheet) as needed for electrical sensor tag applications. As discussed above for display 120, in some embodiments display 720 may additionally or alternatively include light indicators or indicator bars. Thus, for example, a user may obtain a measurement of the electrical parameters by viewing numbers presented on display 720 and/or observing light indicators on display 720.

Figure 7B:
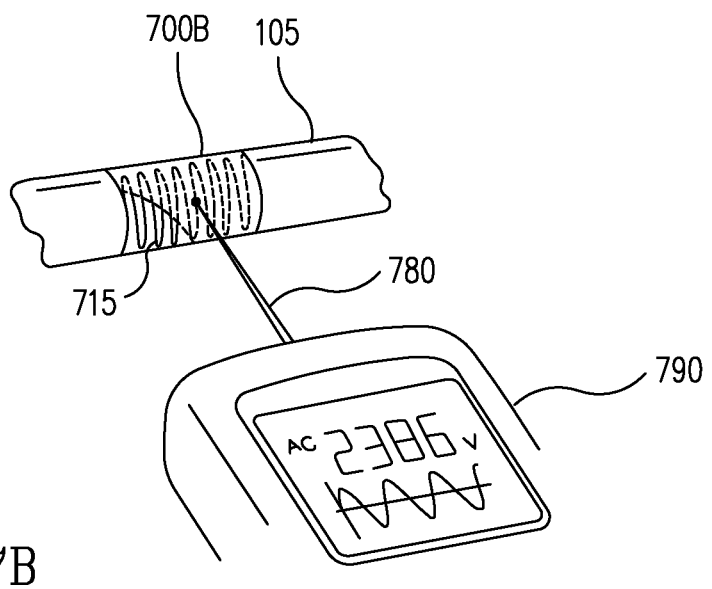
FIG. 7B illustrates the electrical sensor of FIG. 7A being interrogated in accordance with an embodiment of the disclosure.

FIG. 7B shows an electrical sensor tag 700B without the optional display. Electrical sensor tag 700B is shown in FIG. 7B with its exterior surface in a semi-transparent form to better illustrate electrical traces 715 included in electrical sensor tag 700A/700B. Electrical traces 715 may be formed to suitably function as internal inductive and/or capacitive sensor coils to be used for sensing current and/or voltage associated with conductor 105. Electrical sensor tag 700A/700B may include a backing (not shown) having an adhesive or a magnet for mounting electrical sensor tag 700A/700B to conductor 105. In some embodiments, the backing may be flexible so as to accommodate the shape of conductor 105. Thus, a user may affix electrical sensor tags 700A/700B, magnetically, adhesively, or by other means, onto various target objects that the user wishes to obtain measurements of.

Electrical sensor tag 700A/700B may comprise measurement circuitry that is similar to measurement circuitry 300 described above, but miniaturized and/or otherwise modified to be suitable for attachable tag applications. For example, in some embodiments, the measurement circuitry may be implemented using flexible electronic components formed on flex circuit boards (e.g., flex-rigid PCBs). In another example, the wireless transceiver (corresponding to wireless transceiver 312) in electrical sensor tag 700A/700B may implement the RFID hardware and protocols, which may be more suitable for small attachable electrical tag applications.

FIG. 7B also shows electrical sensor tag 700B being interrogated by a user using an external reader 790. As described above for wireless transceiver 312, electrical sensor tag 700A/700B may similarly include a photosensor that can be used to detect a triggering light 780 (e.g., a laser pulse). In response to detecting triggering light 780, the measurement circuitry of sensor tag 700A/700B may be activated to measure various electrical parameters and/or wirelessly transmit (e.g., via WiFi™, Bluetooth™, ZigBee™, or RFID communication) measured and/or stored data. As also described above for wireless transceiver 312, in some embodiments, electrical sensor tag 700A/700B may comprise a modulating retro-reflector or other suitable mechanism to optically transmit data to external reader 790 by selectively reflecting or otherwise modulating incoming light 780. Therefore, for example, a large number of electrical sensor tags 700A/700B may be attached to various conductors inside and outside an electrical cabinet 770, and can conveniently and safely be interrogated at a distance from conductors 105.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

I claim:

1. An electrical sensor for determining an electrical property associated with a target object, the electrical sensor comprising:
    a flexible probe configured to be looped around to at least partially encircle the target object;
    wherein the flexible probe has a proximal end and a distal end, the proximal end terminating in a base portion; and
    wherein the base portion comprises:
        measurement circuitry housed within the base portion and configured to determine a current and/or voltage associated with the target object and sensed via the flexible probe; and
        a display on an external surface of the base portion, wherein the display is configured to display information associated with the determined current and/or voltage.

2. The electrical sensor of claim 1, wherein:
    the flexible probe is elongated and tubular;
    the base portion comprises a socket for removably receiving the distal end of the flexible probe such that the flexible probe forms a closed loop to completely encircle the target object when the distal end of the flexible probe is received in the socket; and
    the flexible probe comprises Rogowski coil, an iron or a ferrite core current transformer, or a Hall effect sensor configured to sense the current associated with the target object.

3. The electrical sensor of claim 1, wherein the flexible probe is configured to resiliently clip onto the target object, and wherein the measurement circuitry comprises a power harvesting circuit configured to divert electrical power induced in the flexible probe for use by the electrical sensor.

4. The electrical sensor of claim 1, wherein the flexible probe is configured to capacitively couple to the target object to sense the voltage associated with the target object, and wherein the measurement circuitry is configured to determine voltage harmonics and/or electrical power associated with the target object.

5. The electrical sensor of claim 1, wherein the display information comprises a numerical value and/or a light indication representative of the current and/or voltage determined by the measurement circuitry.

6. The electrical sensor of claim 1, wherein the measurement circuitry is associated with a unique identifier and comprises a wireless transmitter configured to wirelessly transmit data indicative of the determined current and/or voltage over radio frequency ("RF") or by optical light modulation.

7. The electrical sensor of claim 6, wherein:
the base portion comprises a photosensor configured to sense light; and
the measurement circuitry is configured to detect a triggering light using the photosensor and wirelessly transmit the data via the wireless transmitter in response to detecting the triggering light.

8. A method of obtaining a measurement using the electrical sensor of claim 1, the method comprising:
arranging the flexible probe relative to the target object so as to at least partially encircle the target object;
activating the measurement circuitry to determine the current and/or voltage associated with the target object; and
obtaining data indicative of the determined current and/or voltage by viewing the display disposed on the base portion of the flexible probe and/or by receiving a wireless transmission of the data from a wireless transmitter of the measurement circuitry.

9. The method of claim 8, wherein the arranging the flexible probe comprises:
looping the flexible probe about the target object; and
releasably attaching the distal end of the flexible probe to a socket on the base portion such that the flexible probe forms a closed loop around the target object.

10. The method of claim 8, wherein the arranging the flexible probe comprises deforming the flexible probe against the target object so that the probe elastically receives the target object.

11. An electrical sensor for attaching to and determining an electrical property associate with a target object, the electrical sensor comprising:
a tag having a substantially planar shape and being flexible to at least partially conform to the shape of the target object;
a backing provided on a posterior surface of the tag and configured to attach magnetically or adhesively to the target object;
conductive traces provided in the tag and configured to form at least one of a capacitive sensor or an inductive sensor; and
measurement circuitry provided in the tag and electrically connected to the conductive traces, the measurement circuitry being configured to determine a current and/or voltage associated with the target object sensed via the conductive traces.

12. The electrical sensor of claim 11, further comprising a display provided on a front surface of the tag and configured to present a numerical value and/or a light indication representative of the current and/or voltage determined by the measurement circuitry.

13. The electrical sensor of claim 11, wherein the measurement circuitry is associated with a unique identifier and comprises a wireless transmitter configured to wirelessly transmit data indicative of the determined current and/or voltage over radio frequency ("RF") or by optical light modulation.

14. The electrical sensor of claim 13, further comprising a photosensor provided on a front surface of the tag and configured to sense light, wherein the measurement circuitry is configured to detect a triggering light using the photosensor and wirelessly transmit the data via the wireless transmitter in response to detecting the triggering light.

15. The electrical sensor of claim 11, wherein the measurement circuitry comprises a power harvesting circuit configured to divert electrical power induced in the conductive traces for use by the electrical sensor.

16. A method of obtaining a measurement using the electrical sensor of claim 11, the method comprising:
affixing the electrical sensor onto the target object adhesively or magnetically via the backing;
activating the measurement circuitry to determine the current and/or voltage associated with the target object; and
obtaining data indicative of the determined current and/or voltage by viewing a display disposed on the tag and/or by receiving a wireless transmission of the data from a wireless transmitter of the measurement circuitry.

17. The method of claim 16, wherein the activating the measurement circuitry comprises directing a beam of light onto a photosensor disposed on the tag, so that the measurement circuitry detects the beam of light to responsively start determining the current and/or voltage associated with the target object.

18. An electrical sensor, comprising:
a flexible probe configured to be looped around to at least partially encircle a target object;
wherein the flexible probe has a proximal end and a distal end, the proximal end terminating in a base portion; and
wherein the base portion comprises:
a photosensor configured to sense light; and
measurement circuitry comprising a wireless transmitter, wherein the measurement circuitry is configured to:
determine an electrical parameter associated with the target object and sensed via the flexible probe;
detect a triggering light using the photosensor; and
wirelessly transmit data indicative of the determined electrical parameter via the wireless transmitter in response to detecting the triggering light.

19. The electrical sensor of claim 18, wherein the triggering light is a first triggering light, and wherein the measurement circuitry is further configured to:
detect a second triggering light using the photosensor, wherein the electrical parameter is determined in response to detecting the second triggering light.

20. The electrical sensor of claim 18, wherein the measurement circuitry is configured to wirelessly transit the data as modulated pulses of light.

* * * * *